US008354666B2

(12) United States Patent
Lee et al.

(10) Patent No.: US 8,354,666 B2
(45) Date of Patent: Jan. 15, 2013

(54) ORGANIC POLYMER SEMICONDUCTOR, METHOD OF PREPARING THE SAME, AND AMBIPOLAR ORGANIC THIN FILM TRANSISTOR USING THE SAME

(75) Inventors: Bang Lin Lee, Yongin-si (KR); Eun Kyung Lee, Yongin-si (KR); Kook Min Han, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1663 days.

(21) Appl. No.: 11/790,755

(22) Filed: Apr. 27, 2007

(65) Prior Publication Data

US 2008/0099758 A1  May 1, 2008

(30) Foreign Application Priority Data

Oct. 30, 2006  (KR) .................... 10-2006-0105649

(51) Int. Cl.
*H01L 51/00* (2006.01)

(52) U.S. Cl. .......................................... 257/40; 365/129

(58) Field of Classification Search .................. 365/129, 365/161, 163; 257/1, 14–25, 40, 59, 72, 257/250, E29.071, E25.004, E27.083, E27.16; 438/48, 197, 479, 590, 962; 977/708, 774, 977/775, 773, 778, 759, 847

See application file for complete search history.

(56) References Cited

U.S. PATENT DOCUMENTS

| 5,625,199 | A | 4/1997 | Baumbach et al. |
| 6,107,117 | A | 8/2000 | Bao et al. |
| 6,452,207 | B1 | 9/2002 | Bao |
| 6,621,099 | B2 | 9/2003 | Ong et al. |
| 7,030,409 | B2 | 4/2006 | Lee et al. |
| 7,495,251 | B2 * | 2/2009 | Zhu et al. ................ 257/40 |
| 7,667,230 | B2 * | 2/2010 | Zhu et al. ................ 257/40 |
| 2004/0253836 | A1 * | 12/2004 | Sirringhaus et al. ........ 438/780 |
| 2004/0256615 | A1 * | 12/2004 | Sirringhaus et al. ........ 257/40 |
| 2004/0263739 | A1 * | 12/2004 | Sirringhaus et al. ........ 349/135 |

FOREIGN PATENT DOCUMENTS

WO     00/79617     12/2000

* cited by examiner

*Primary Examiner* — Richard Elms
(74) *Attorney, Agent, or Firm* — Harness, Dickey & Pierce, P.L.C.

(57) ABSTRACT

Disclosed are an organic polymer semiconductor, an ambipolar organic thin film transistor using the same, an electronic device comprising the ambipolar organic thin film transistor and methods of fabricating the same. Example embodiments relate to an organic polymer semiconductor, which may include an aromatic ring derivative having p-type semiconductor properties and a heteroaromatic ring having n-type semiconductor properties in the main chain thereof, and which thus may exhibit both p-type transistor properties and n-type transistor properties when used in the organic active layer of an electronic device, e.g., an organic thin film transistor, an ambipolar organic thin film transistor using such an organic polymer semiconductor, an electronic device comprising the ambipolar organic thin film transistor and methods of fabricating the same.

11 Claims, 2 Drawing Sheets

ORGANIC POLYMER SEMICONDUCTOR, METHOD OF PREPARING THE SAME, AND AMBIPOLAR ORGANIC THIN FILM TRANSISTOR USING THE SAME

PRIORITY STATEMENT

This non-provisional application claims priority under U.S.C. §119 to Korean Patent Application No. 10-2006-0105649, filed on Oct. 30, 2006, in the Korean Intellectual Property Office (KIPO), the entire contents of which are herein incorporated by reference.

BACKGROUND

1. Field

Example embodiments relate to an organic polymer semiconductor, an ambipolar organic thin film transistor (ambipolar OTFT) using the same, an electronic device comprising the ambipolar organic thin film transistor and methods of fabricating the same. Other example embodiments relate to an organic polymer semiconductor, which may include an aromatic ring derivative having p-type semiconductor properties and a heteroaromatic ring having n-type semiconductor properties in the main chain thereof, and which thus may exhibit both p-type transistor properties and n-type transistor properties when used in the organic active layer of an electronic device, e.g., an organic thin film transistor (OTFT), an ambipolar OTFT using the same, an electronic device comprising the ambipolar organic thin film transistor and methods of fabricating the same.

2. Description of the Related Art

After the development of polyacetylene, which is a conjugated organic polymer having semiconductor properties, organic semiconductors have started receiving attention as an electric and electronic material thanks to the advantages of organic material, for example, the variety of synthesis methods, easier formability into fibers or films, flexibility, conductivity, and decreased preparation costs, and thus have been intensively and extensively studied in the wide field of functional electronic devices and optical devices.

Among devices using such a conductive polymer, research into OTFTs using organic material as an active layer is being conducted all over the world these days. Compared to conventional Si-based TFTs, OTFTs are advantageous because a semiconductor layer may be formed through a printing process under atmospheric pressure in place of plasma-enhanced chemical vapor deposition, and all of the fabrication processes may be carried out through a roll-to-roll process using a plastic substrate, if necessary, thereby decreasing the cost of fabricating the transistor. Accordingly, the OTFT may be variously applicable to devices for driving active displays, smart cards and/or plastic chips for inventory tags.

Generally, an organic thin film transistor, comprising a substrate, a gate electrode, an insulating layer, source/drain electrodes, and a channel layer, may be classified as a bottom contact type, in which the channel layer is formed on the source/drain electrodes, and a top contact type, in which a metal electrode is formed on the channel layer through mask deposition. In recent years, in the display field, flat panel displays (FPDs), typically represented by liquid crystal displays (LCDs), have been spotlighted. Therefore, in order to fabricate displays, which have larger areas and are inexpensive and flexible, the channel layer of the OTFT may be required to consist of an organic semiconductor material able to be subjected to a low-temperature solution process, instead of an inorganic semiconductor material, e.g., silicon (Si), which is expensive and requires a high-temperature vacuum process.

Moreover, much research effort has been directed toward organic semiconductor material for the channel layer of the OTFT, and also transistor properties thereof have been reported. Examples of low-molecular-weight or oligomer organic semiconductor material may include merocyanine, phthalocyanine, perylene, pentacene, $C_{60}$ and/or thiopheneoligomer. The use of pentacene monocrystals has been reported to result in increased charge mobility of about 3.2~5.0 $cm^2/Vs$ or more. However, when using low-molecular-weight organic semiconductor, a vacuum deposition process may be mainly applied to form the channel layer.

Although OTFTs fabricated using a thiophene polymer as polymer material have properties undesirable when compared with OTFTs using low-molecular-weight material, they are advantageous in terms of processibility because a larger area may be realized at a decreased price through a solution process, e.g., printing. In this regard, research has already reported the experimental fabrication of a polymer-based OTFT using a polythiophene material, called $F_8T_2$, leading to charge mobility of about 0.01~0.02 $cm^2/Vs$. As mentioned above, the polymer-based organic semiconductor material may have TFT properties, e.g., charge mobility, which may be undesirable when compared with low-molecular-weight material including pentacene. However, the polymer-based organic semiconductor material may eliminate the need for increased operating frequency and enables the inexpensive fabrication of TFTs.

In order to commercialize the OTFTs, an increased on/off ratio, as an important parameter, in addition to charge mobility, should be achieved. Leakage current in an off-state may be minimized or reduced. Thus, various attempts to improve such properties are being made these days.

The related art discloses an OTFT comprising an active layer composed of n-type inorganic semiconductor material and p-type organic semiconductor material to thus slightly improve the properties thereof, which is still difficult to use and realize mass production because the fabrication process is similar to that of a conventional Si-based TFT. In addition, the related art discloses an OTFT having charge mobility of about 0.01~0.04 $cm^2/Vs$ using regioregular polythiophene $P_3HT$. When using $P_3HT$ as representative regioregular polythiophene, the charge mobility may be merely about 0.01 $cm^2/Vs$ but cut-off leakage current may be increased (about $10^{-9}$ A or more), and thus the on/off ratio may be undesirably decreased, to an extent of about 400 or less, consequently making it impossible to serve in an electronic device. Thorough research into organic semiconductor polymers for polymer-based OTFTs satisfying both increased charge mobility and decreased cut-off leakage current has been conducted, but there is only a small number of reported examples.

The organic semiconductor material for OTFTs, which is classified into low-molecular-weight material and polymeric material, may be further divided into p-type material (hole transport), n-type material (electron transport), and charge-transfer (CT) material simultaneously exhibiting the above two properties, depending on the type of carrier. Separately from the type of organic semiconductor material, the transistor is classified into a p-type transistor, an n-type transistor, and an ambipolar or bipolar transistor.

Because almost all of the initially developed semiconductor materials are p-channel type, exhibiting hole transport upon the application of negative voltage, the recent development of polymer semiconductor material has been primarily conducted toward n-type material, or semiconductor material for ambipolar TFTs. With the goal of manufacturing CMOS circuits required for the design of various electronic devices, there is a need for the development of n-type material or semiconductor material for ambipolar transistors, as organic semiconductor material along with p-type semiconductor material.

SUMMARY

Accordingly, example embodiments have been made keeping in mind the above problems occurring in the related art, and example embodiments provide an organic polymer semiconductor, which contains a quinoxaline ring having n-type semiconductor properties and aromatic rings having p-type semiconductor properties in the main chain thereof, and thus may exhibit both p-type electrical properties and n-type electrical properties, thereby making it possible to serve in ambipolar OTFTs. Example embodiments provide a method of preparing such an organic polymeric semiconductor. Example embodiments also provide an ambipolar OTFT using the organic polymer semiconductor material as an organic active layer to thus realize both increased charge mobility and decreased cut-off leakage current, an electronic device comprising the ambipolar organic thin film transistor and methods of fabricating the same.

Example embodiments provide an organic polymer semiconductor, represented by Formula 1 below:

Formula 1

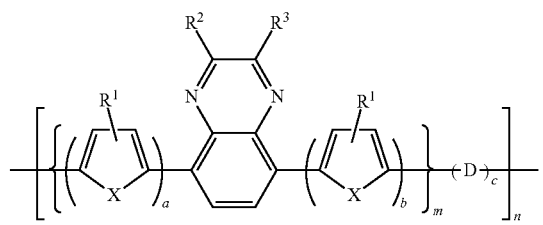

wherein $R^1$ is hydrogen, a hydroxyl group, a $C_{1-20}$ linear, branched or cyclic alkyl group, a $C_{1-20}$ alkoxyalkyl group, or a $C_{1-16}$ linear, branched or cyclic alkoxy group, $R^2$ and $R^3$ are each independently hydrogen, a hydroxyl group, a $C_{1-20}$ linear, branched or cyclic alkyl group, a $C_{1-20}$ alkoxyalkyl group, a $C_{1-16}$ linear, branched or cyclic alkoxy group, or a $C_{4-30}$ substituted or unsubstituted aryl group or heteroaryl group, D is a $C_{4-30}$ aryl group or alkylene substituted with an electron-withdrawing side-chain, including —CN, —NO$_2$, —COOR, fluorine or $C_{1-16}$ perfluoroalkyl group, and X is S, O, Se, N—H, or N—R, R is hydrogen or a $C_{1-6}$ linear, branched or cyclic alkyl group, a, b and c are each independently an integer of about 1 or about 2, m is an integer from about 1 to about 4, and n is an integer from about 4 to about 100.

Example embodiments provide a method of preparing an organic polymer semiconductor, comprising copolymerizing a monomer represented by Formula 2 below with a monomer represented by Formula 3 below in the presence of a catalyst:

Formula 2

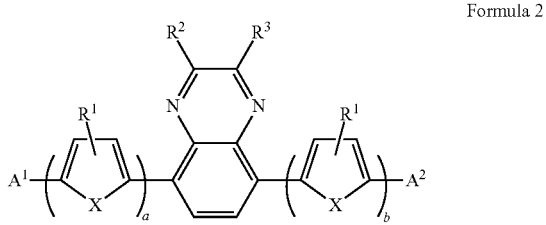

wherein $R^1$, $R^2$ and $R^3$ are as defined in Formula 1, $A^1$ and $A^2$ are each independently Br, Cl or I, X is as defined in Formula 1, and a and b are each independently an integer of about 1 or about 2; and Formula 3

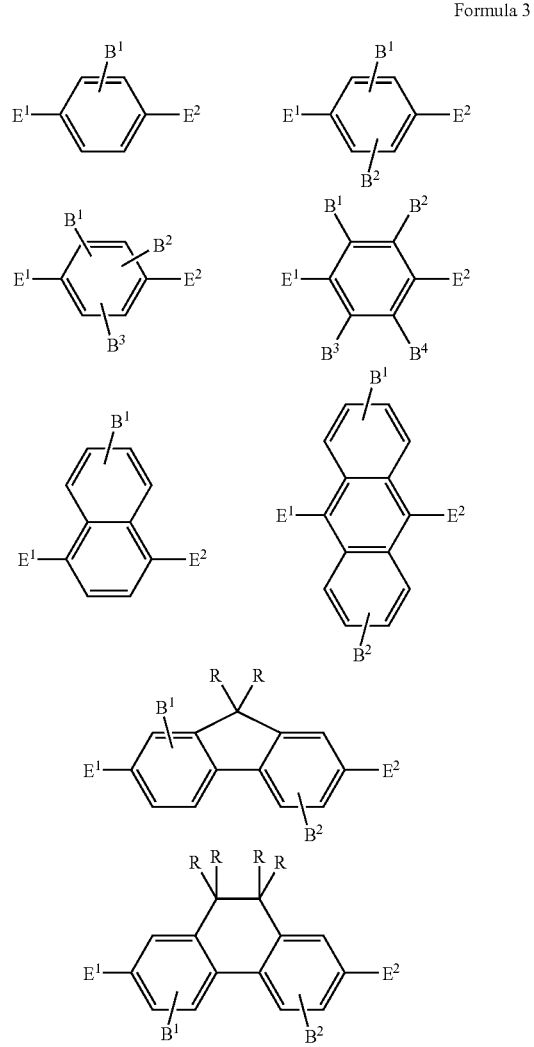

wherein $B^1$, $B^2$, $B^3$ and $B^4$ are each independently H, —CN, —NO$_2$, —COOR, fluorine, or a $C_{1-16}$ perfluoroalkyl group, $E^1$ and $E^2$ are each independently a halogen atom, including Br, Cl or I, a trialkyltin group, or a borane group, and R is hydrogen or a $C_{1-6}$ linear, branched or cyclic alkyl group.

Example embodiments also provide an ambipolar OTFT, wherein an organic active layer includes the organic polymer semiconductor mentioned above and an electronic device comprising the ambipolar organic thin film transistor of example embodiments.

Example embodiments provide a method of fabricating an ambipolar organic thin film transistor that includes forming a gate electrode, a gate insulating layer, an organic active layer, and source/drain electrodes on a substrate, wherein the organic active layer includes the organic polymer semiconductor fabricated according to example embodiments. Example embodiments also provide a method of fabricating an electronic device that includes forming the ambipolar organic thin film transistor according to example embodiments.

BRIEF DESCRIPTION OF THE DRAWINGS

Example embodiments will be more clearly understood from the following detailed description taken in conjunction with the accompanying drawings.

FIG. 1 is a schematic sectional view illustrating a bottom contact type OTFT, according to example embodiments;

FIG. 2 is a schematic sectional view illustrating a top contact type OTFT, according to example embodiments;

FIG. 3 is a graph illustrating the Vd-Id of the drain electrode of the OTFT fabricated using the polymer semiconductor of Preparative Example 4;

FIG. 4 is a graph illustrating the $V_{GS}$-$I_{DS}$ of the OTFT fabricated using the polymer semiconductor of Preparative Example 4 when exhibiting p-type transistor properties; and FIG. 5 is a graph illustrating the $V_{GS}$-$I_{DS}$ of the OTFT fabricated using the polymer semiconductor of Preparative Example 4 when exhibiting n-type transistor properties.

Figure 1:
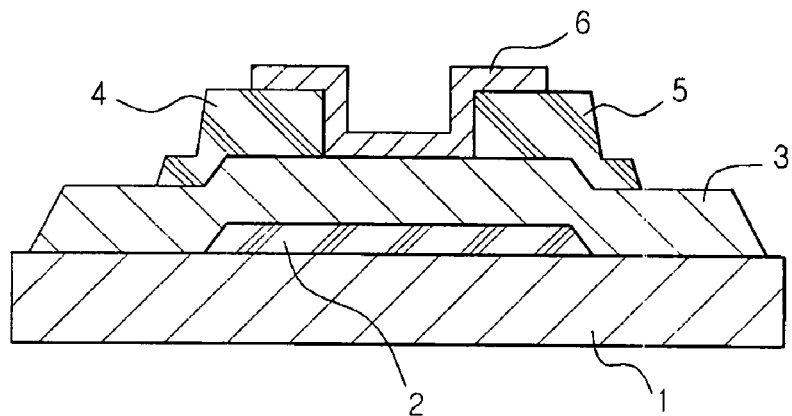
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a detailed description will be given of example embodiments with reference to the appended drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, the ambipolar organic polymer semiconductor may be represented by Formula 1 below:

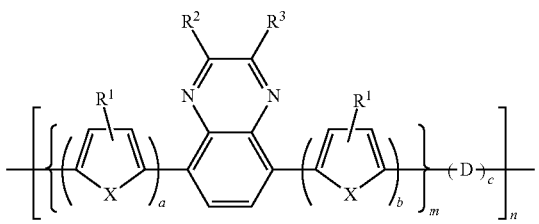

Formula 1 wherein $R^1$ is hydrogen, a hydroxyl group, a $C_{1-20}$ linear, branched or cyclic alkyl group, a $C_{1-20}$ alkoxyalkyl group, or a $C_{1-16}$ linear, branched or cyclic alkoxy group, $R^2$ and $R^3$ are each independently hydrogen, a hydroxyl group, a $C_{1-20}$ linear, branched or cyclic alkyl group, a $C_{1-20}$ alkoxyalkyl group, a $C_{1-16}$ linear, branched or cyclic alkoxy group, or a $C_{4-30}$ substituted or unsubstituted aryl group or heteroaryl group, D is a $C_{4-30}$ aryl group or alkylene substituted with an electron-withdrawing side-chain including —CN, —NO$_2$, —COOR, fluorine or $C_{1-16}$ perfluoroalkyl group, and X is S, O, Se, N—H, or N—R, R is hydrogen or a $C_{1-6}$ linear, branched or cyclic alkyl group, a, b and c are each independently an integer of about 1 or about 2, m is an integer from about 1 to about 4, and n is an integer from about 4 to about 100.

The organic polymer semiconductor of example embodiments may include a quinoxaline ring having n-type semiconductor properties and aromatic rings having p-type semiconductor properties are contained in the main chain of the polymer semiconductor, thus exhibiting both p-type electrical properties and n-type electrical properties, resulting in applicability to ambipolar OTFT.

In the ambipolar organic polymer semiconductor of Formula 1, examples of the monomer D may include compounds represented by Formula 3 below:

Formula 3

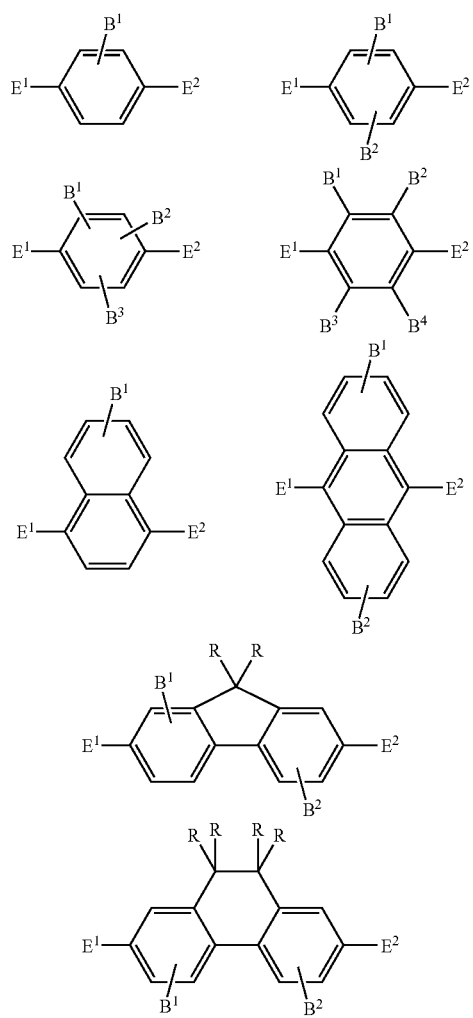

wherein $B^1$, $B^2$, $B^3$ and $B^4$ are each independently H, —CN, —NO$_2$, —COOR, fluorine, or a $C_{1-16}$ perfluoroalkyl group, $E^1$ and $E^2$ are each independently a halogen atom, including Br, Cl or I, a trialkyltin group, or a borane group, and R is hydrogen or a $C_{1-6}$ linear, branched or cyclic alkyl group.

Examples of the monomer of Formula 3 may include monomers represented by Formula 4 below:

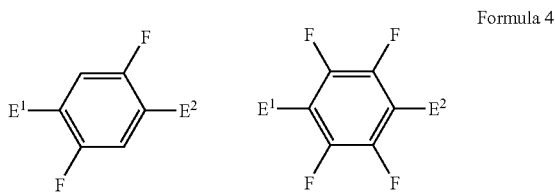

Formula 4 wherein $E^1$ and $E^2$ are as defined in Formula 3.

Representative examples of the ambipolar organic polymer semiconductor of example embodiments may include polymer compounds represented by Formulas 5a to 5j below:

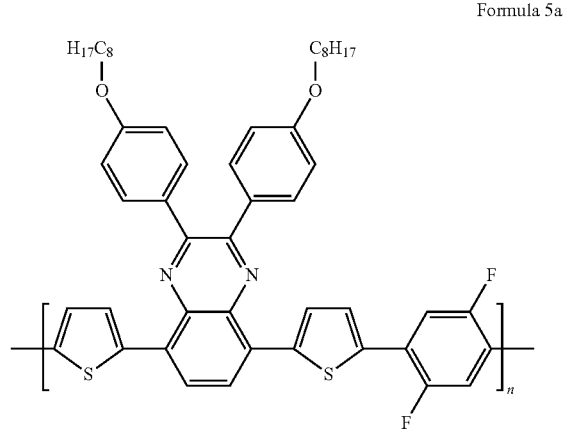

Formula 5a

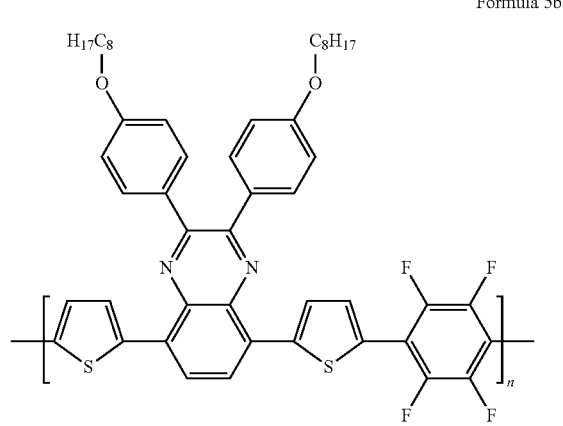

Formula 5b

Formula 5c
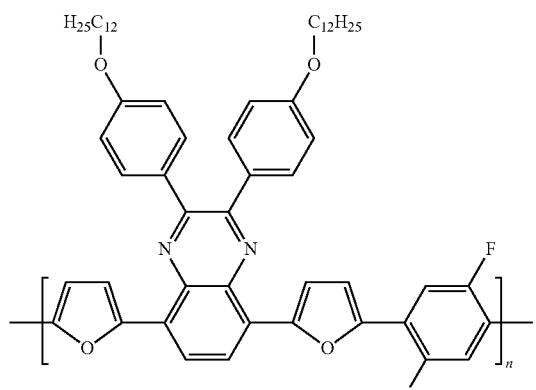

Formula 5d
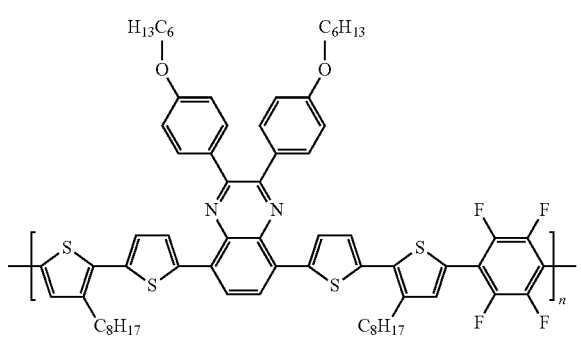

Formula 5e
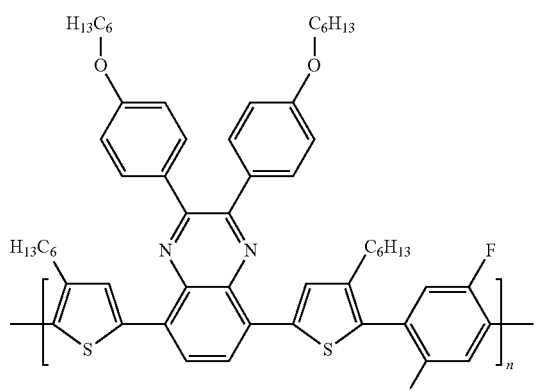

Formula 5f
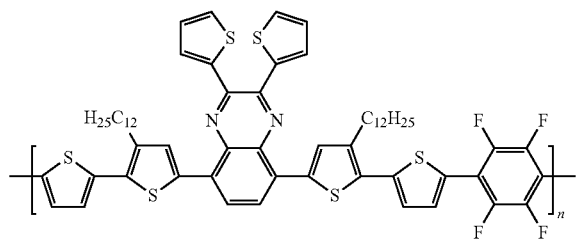

Formula 5g
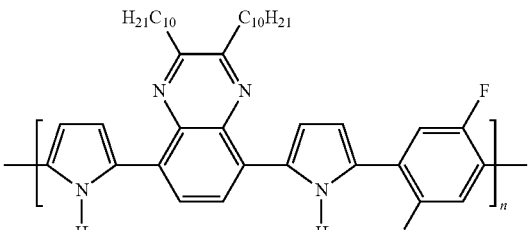

Formula 5h
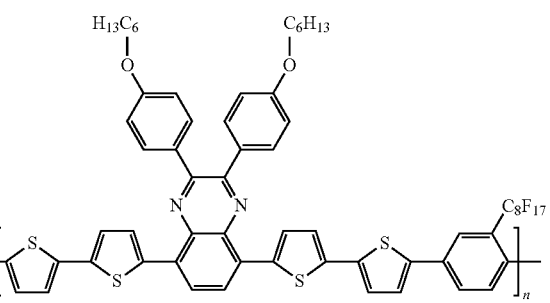

Formula 5i
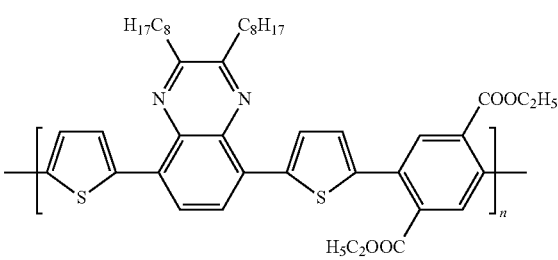

Formula 5j
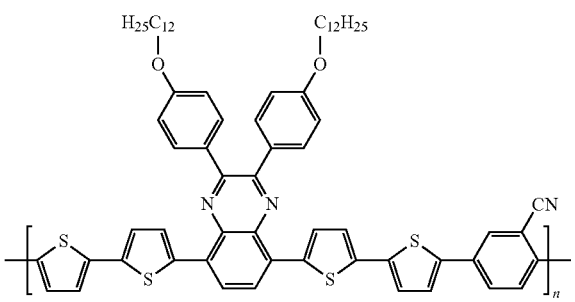

in Formulas 5a to 5j, n is an integer from about 4 to about 100.

In addition, example embodiments provide a method of preparing the organic polymer semiconductor. In the method of example embodiments, a monomer represented by Formula 2 below may be copolymerized with a monomer represented by Formula 3 below in the presence of a catalyst, to thus prepare the organic polymer semiconductor of Formula 1:

Formula 2

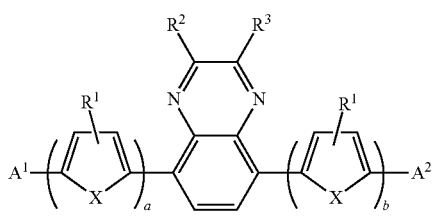

wherein $R^1$, $R^2$ and $R^3$ are as defined in Formula 1, $A^1$ and $A^2$ are each independently Br, Cl or I, X is as defined in Formula 1, and a and b are each independently an integer of about 1 or about 2; and Formula 3

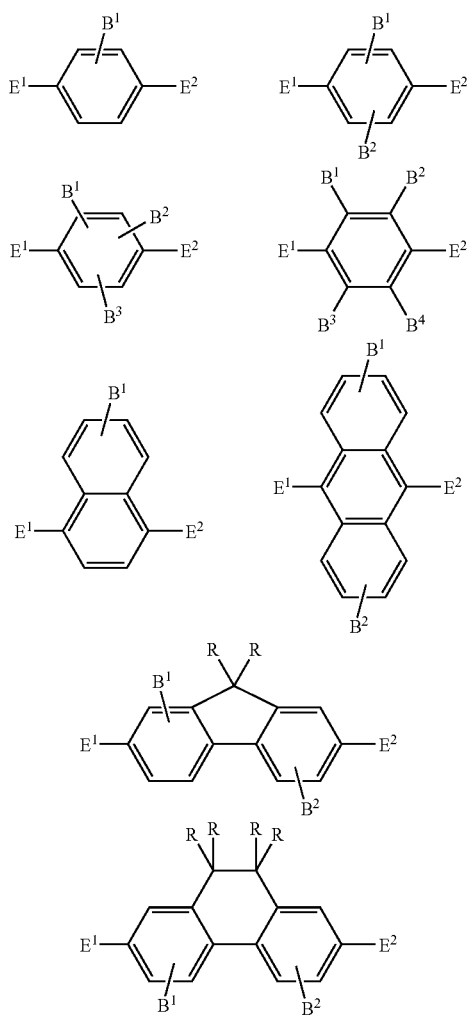

wherein $B^1$, $B^2$, $B^3$ and $B^4$ are each independently H, —CN, —$NO_2$, —COOR, fluorine, or a $C_{1-16}$ perfluoroalkyl group, $E^1$ and $E^2$ are each independently a halogen atom, including Br, Cl or I, a trialkyltin group, or a borane group, and R is hydrogen or a $C_{1-6}$ linear, branched or cyclic alkyl group.

The monomer containing quinoxaline of Formula 2 may be synthesized by subjecting heteroaryl borolane or heteroaryl trialkyltin and a dihaloquinoxaline derivative as starting materials to a coupling reaction using a palladium catalyst according to Reaction 1 below:

Reaction 1

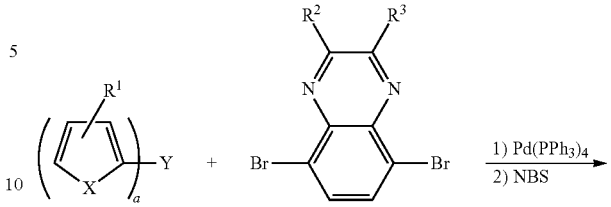

Pd(PPh$_3$)$_4$=tetrakis(triphenylphosphine) palladium (0)
NBS=N-bromosuccinimide wherein $R^1$, $R^2$, $R^3$ and X are as defined in Formula 1, Y is a trialkyltin group or a borane group, and a and b are each independently an integer of about 1 or about 2.

Representative examples of the compound of Formula 2 may include, but may not be limited to, compounds represented by Formula 6 below:

Formula 6

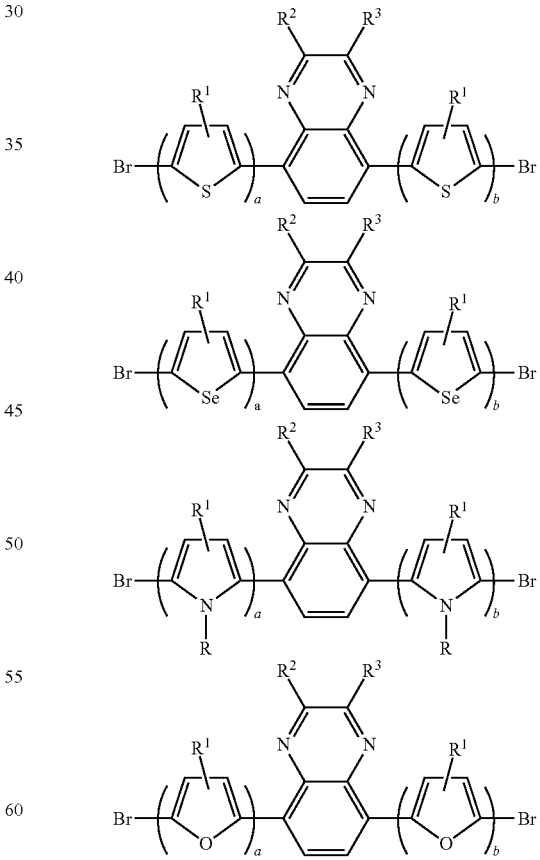

wherein $R^1$, $R^2$ and $R^3$ are as defined in Formula 1, R is hydrogen or a $C_{1-6}$ linear, branched or cyclic alkyl group, and a and b are each independently an integer of about 1 or about 2.

Although the catalyst used in the method of example embodiments may not be particularly limited, examples thereof may include palladium and nickel catalysts represented by Formulas 7 and 8 below, as reported by Stille et al (Angew. Chem. Int. Ed. Engl. 1986, Vol. 25, pp. 508-524), Suzuki et al (J. Am. Chem. Soc. 1989, Vol. 111, pp. 314-321), McCullough et al (U.S. Pat. No. 6,166,172, 1999) or Yamamoto et al. (Macromolecules 1992, Vol. 25, pp. 1214-1226):

$PdL_4$ or $PdL_2Cl_2$     Formula 7 wherein L is a ligand selected from the group consisting of triphenylphosphine ($PPh_3$), triphenylarsine ($AsPh_3$) and triphenylphosphite $P(OPh)_3$; and

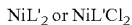

$NiL'_2$ or $NiL'Cl_2$     Formula 8 wherein L' is a ligand selected from the group consisting of 1,5-cyclooctadiene, 1,3-diphenylphosphinopropane, 1,2-bis(diphenylphosphino)ethane and 1,4-diphenylphosphinobutane. Specific examples of the nickel (0) catalyst may include bis(1,5-cyclooctadiene) nickel (0) compound [$Ni(COD)_2$], and examples of the nickel (II) catalyst may include 1,3-diphenylphosphino propane nickel (II) chloride [$Ni(dppp)Cl_2$] and 1,2-bis(diphenylphosphino)ethane nickel (II) chloride [$Ni(dppe)Cl_2$].

An example of the polymerization using the monomer synthesized in Reaction 1 is shown in Reaction 2 below, but the polymerization process of example embodiments may not be limited thereto:

(NMP). The polycondensation may be performed at about 60° C.~about 120° C. for about 12 hours~about 72 hours in a nitrogen atmosphere.

The polymer semiconductor obtained through Reaction 2 may have a number average molecular weight ranging from about 5,000 to about 50,000, for example, from about 10,000 to about 15,000.

Figure 2:
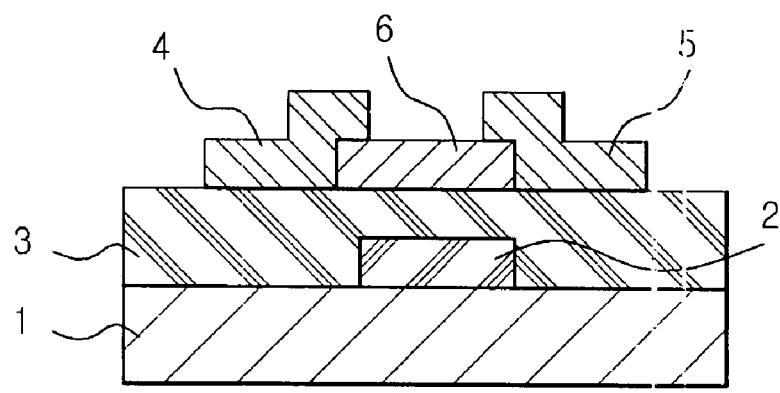

In addition, example embodiments may provide an OTFT including an active layer formed using the organic polymer semiconductor of example embodiments. The OTFT of example embodiments may include a substrate 1, a gate electrode 2, a gate insulating layer 3, source/drain electrodes 4, 5, and an active layer 6, as seen in FIG. 1, or alternatively may include a substrate 1, a gate electrode 2, a gate insulating layer 3, an active layer 6, and source/drain electrodes 4, 5, as seen in FIG. 2, but example embodiments may not be limited thereto.

In order to form the organic active layer 6 using the organic polymer semiconductor of example embodiments, a composition for the organic active layer including chloroform or chlorobenzene may be used.

Examples of the solvent used in the composition for the organic active layer may include chloroform, chlorobenzene, dichlorobenzene, trichlorobenzene, and toluene. Examples of the process of forming the organic active layer 6 may include, but may not be limited to, screen printing, printing, spin coating, dipping or ink jetting.

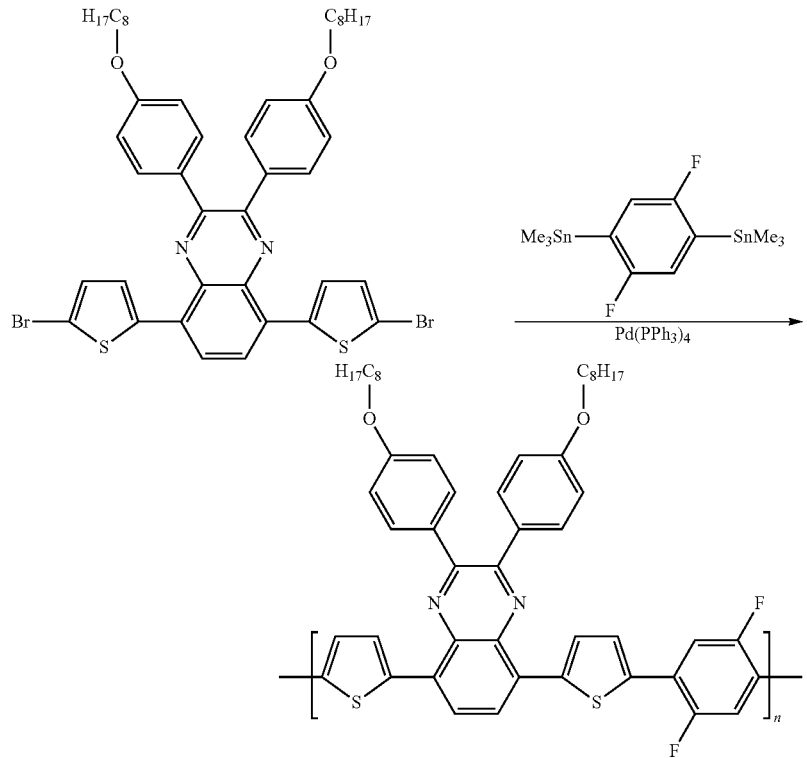

Reaction 2 wherein n is an integer from about 4 to about 100.

The catalyst, e.g., a palladium (0) compound exemplified by tetrakis(triphenylphosphine) palladium(0) ($Pd(PPh_3)_4$), may be used in an amount of about 0.2 mol %~about 15 mol % based on the monomer. Examples of the polymerization solvent may include toluene, dimethylformaldehyde (DMF), tetrahydrofuran (THF) and/or N-methylpyrrolidinone As such, in the gate insulating layer 3 included in the OTFT of example embodiments, any insulator having a high dielectric constant may be used as long as it is typically known in the art. Specific examples thereof may include, but may not be limited to, a ferroelectric insulator, including $Ba_{0.33}Sr_{0.66}TiO_3$ (BST: Barium Strontium Titanate), $Al_2O_3$, $Ta_2O_5$, $La_2O_5$, $Y_2O_5$, or $TiO_2$, an inorganic insulator, including PbZr$_{0.33}$Ti$_{0.66}$O$_3$ (PZT), Bi$_4$Ti$_3$O$_{12}$, BaMgF$_4$, SrBi$_2$(TaNb)$_2$O$_9$, Ba(ZrTi)O$_3$(BZT), BaTiO$_3$, SrTiO$_3$, Bi$_4$Ti$_3$O$_{12}$, SiO$_2$, SiNx, or AlON, or an organic insulator, including polyimide, benzocyclobutane (BCB), parylene, polyvinylalcohol, or polyvinylphenol.

In the gate electrode 2 and the source/drain electrodes 4, 5 included in the OTFT of example embodiments, a typical metal may be used, specific examples thereof including, but not being limited to, gold (Au), silver (Ag), aluminum (Al), nickel (Ni), and indium tin oxide (ITO). Examples of material for the substrate 1 included in the OTFT of example embodiments may include, but may not be limited to, glass, polyethylenenaphthalate (PEN), polyethyleneterephthalate (PET), polycarbonate, polyvinylalcohol, polyacrylate, polyimide, polynorbornene, or polyethersulfone (PES).

Example embodiments also provide an electronic device comprising the ambipolar organic thin film transistor of example embodiments. Because the organic polymer semiconductor of example embodiments serves to improve the device characteristics of an ambipolar organic thin film transistor, the organic polymer semiconductor may be effectively used to fabricate a variety of electronic devices, including liquid crystal display (LCD) devices, photovoltaic devices, organic light-emitting devices (OLEDs), sensors, memory devices and/or integrated circuits. These electronic devices may be fabricated using the organic polymer semiconductor of example embodiments by any common process.

Example embodiments also provide a method of fabricating an ambipolar organic thin film transistor which may include forming a gate electrode, a gate insulating layer, an organic active layer, and source/drain electrodes on a substrate, wherein the organic active layer includes the organic polymer semiconductor fabricated according to example embodiments.

The organic active layer may be formed into a thin film through screen printing, printing, spin coating, dipping or ink jetting. The insulating layer may be formed using material selected from the group consisting of ferroelectric insulators including Ba$_{0.33}$Sr$_{0.66}$TiO$_3$(BST), Al$_2$O$_3$, Ta$_2$O$_5$, La$_2$O$_5$, Y$_2$O$_5$, and TiO$_2$; inorganic insulators including PbZr$_{0.33}$Ti$_{0.66}$O$_3$ (PZT), Bi$_4$Ti$_3$O$_{12}$, BaMgF$_4$, SrBi$_2$(TaNb)$_2$O$_9$, Ba(ZrTi)O$_3$(BZT), BaTiO$_3$, SrTiO$_3$, Bi$_4$Ti$_3$O$_{12}$, SiO$_2$, SiNx, and AlON; and organic insulators including polyimide, benzocyclobutane (BCB), parylene, polyvinylalcohol, and polyvinylphenol. The substrate may be formed using material selected from the group consisting of glass, polyethylenenaphthalate (PEN), polyethyleneterephthalate (PET), polycarbonate, polyvinylalcohol, polyacrylate, polyimide, polynorbornene, and polyethersulfone (PES). The gate electrode and the source/drain electrodes may be formed using material selected from the group consisting of gold (Au), silver (Ag), aluminum (Al), nickel (Ni), and indium tin oxide (ITO).

Example embodiments also provide a method of fabricating an electronic device that may include forming the ambipolar organic thin film transistor according to example embodiments.

A better understanding of example embodiments may be obtained in light of the following examples, which are set forth to illustrate, but are not to be construed to limit example embodiments.

PREPARATIVE EXAMPLE 1

Synthesis of 5,8-Dibromoquinoxaline Derivative

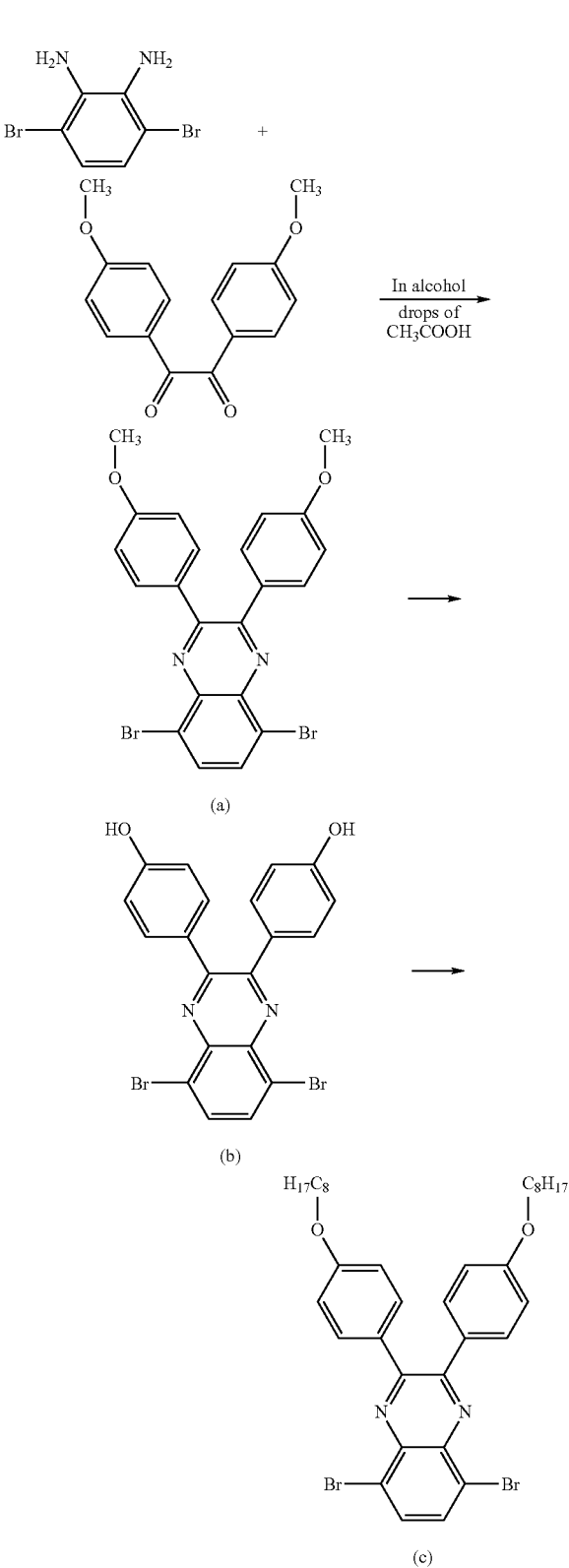

PREPARATIVE EXAMPLE 1-a

Synthesis of 5,8-Dibromoquinoxaline Derivative (a)

To about 60 ml of a solution of 3,6-dibromo-o-phenylenediamine (about 4.0 g, about 15.0 mmol) in butanol, glacial acetic acid was added in an amount of about 2~about 3 droplets, and then the solution was stirred at about 120° C. for about 5 hours. The resulting reaction solution was cooled to about 0° C. and filtered, and the separated solid was washed two times with hot ethanol and then dried. (Yield: about 9.6 mmol, about 64%.)

$^1$H-NMR (300 MHz, CDCl$_3$) δ(ppm) 3.85 (s, 6H, Phenyl-O—CH$_3$), 6.89 (d, 4H, Phenyl-H), 7.66 (d, 4H, Phenyl-H), 7.85 (d, 2H, Quinoxaline-H).

PREPARATIVE EXAMPLE 1-b

Synthesis of 5,8-Dibromoquinoxaline Derivative (b)

Into a recovery flask, a 5,8-dibromoquinoxaline derivative (a) (about 4.55 g, about 9.1 mmol) and about 30 equivalents of pyridine hydrochloride (Py-HCl, about 40 g) were added, stirred at about 200° C. for about 8 hours, and then cooled to about room temperature. About 80 ml of an aqueous hydrochloric acid (about 2.5%) was added thereto, and the reaction solution was stirred well and then separated with ether. The organic layer was treated with dilute aqueous hydrochloric acid, aqueous sodium hydroxide, and aqueous hydrochloric acid, in that order, and then further separated with ether. The resultant organic layer was washed with water, and then dried using a drying agent, thereby obtaining a yellow solid. (Yield: about 8.7 mmol, about 96%.)

PREPARATIVE EXAMPLE 1-c

Synthesis of 5,8-Dibromoquinoxalne Derivative (c)

A solution of 5,8-dibromoquinoxalne derivative (b) (about 6.0 g, about 12.7 mmol) and aqueous potassium hydroxide (KOH, about 0.5 M, about 32 mmol) in ethanol was stirred at about room temperature for about 1 hour and then added with n-bromohexane (about 5.25 g, about 32 mmol). The reaction solution was allowed to react at about 70° C. for about 24 hours, cooled to about −20° C., and then filtered. Subsequently, column purification (development solvent: chloroform, filler: silica gel SiO$_2$) was performed, thus obtaining a yellow solid. (Yield: about 2.2 mmol, about 51%.)

$^1$H-NMR (300 MHz, CDCl$_3$) δ(ppm) 0.92 (6H, CH$_3$), 1.32~1.50 (m, 24H, —(CH$_2$)$_n$—), 1.80 (m, 4H, —CH$_2$—), 3.99 (t, 4H, Phenyl-O—CH$_2$—), 6.87 (d, 4H, Phenyl-H), 7.64 (d, 4H, Phenyl-H), 7.85 (d, 2H, Quinoxaline-H).

PREPARATIVE EXAMPLE 2

Synthesis of Quinoxaline-Monomer Trimer in

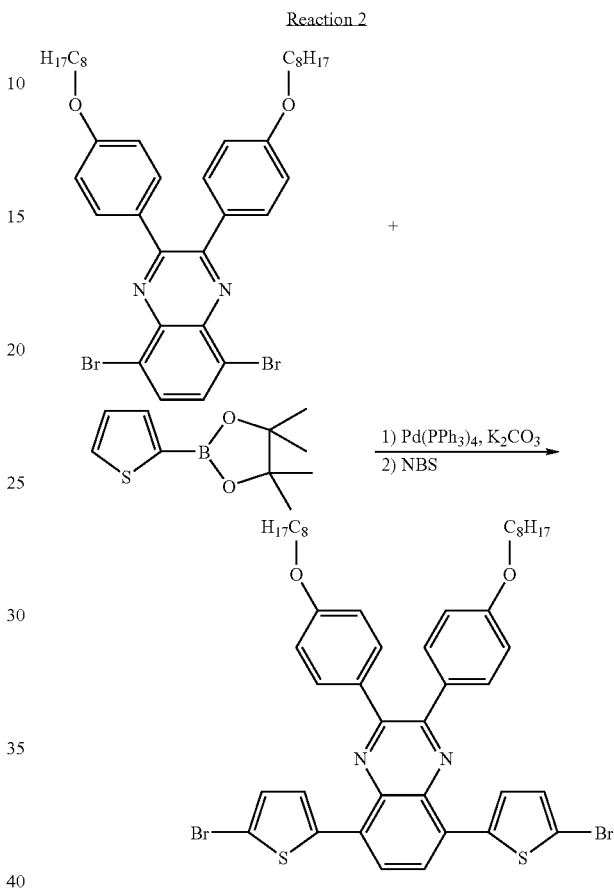

Reaction 2

In a reactor in a nitrogen atmosphere, while a solution (about 25 ml) of about 3.5 g (about 5.0 mmol) of 5,8-dibromoquinoxaline derivative synthesized in Preparative Example 1 (see: T. Yamamoto, et al. J. Am. Chem. Soc, 1996, Vol. 118, pp. 3930~3937) and an excess of 2-thiophene borane derivative (about 15.0 mmol) in anhydrous THF was stirred, aqueous potassium carbonate (K$_2$CO$_3$, about 20 g, about 150 mmol) and about 10 mol % (about 578 mg, about 0.5 mmol) of a palladium catalyst (Pd(PPh$_3$)$_4$), based on the monomer, were added, and then the solution was allowed to react at about 80° C.~about 85° C. for about 24 hours. The resultant reaction solution was treated with dilute aqueous hydrochloric acid and then extracted with chloroform. The obtained organic layer was distilled under reduced pressure, slightly washed with methanol, and dried, to thus prepare a thiophene-quinoxaline trimer, which was then reacted with NBS in a mixture of chloroform and acetic acid, thereby obtaining an orange solid thiophene-quinoxaline derivative (Yield: about 72%).

$^1$H-NMR (300 MHz, CDCl$_3$) δ(ppm) 0.90 (CH$_3$), 1.32~1.44 (CH$_2$), 1.72 (CH$_2$), 3.76~4.00 (—O—CH$_2$), 6.75 (Phenyl-H), 7.42~7.88 (Thiophene-H and Phenyl-H), 8.24 (Qunioxaline-H).

PREPARATIVE EXAMPLE 3

Synthesis of Monomer Trimer in Reaction 2

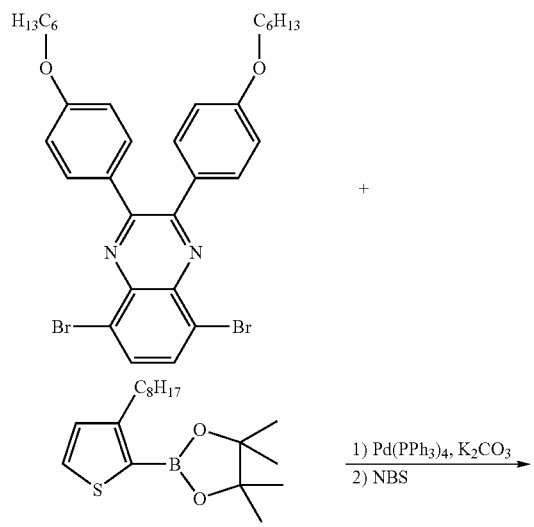

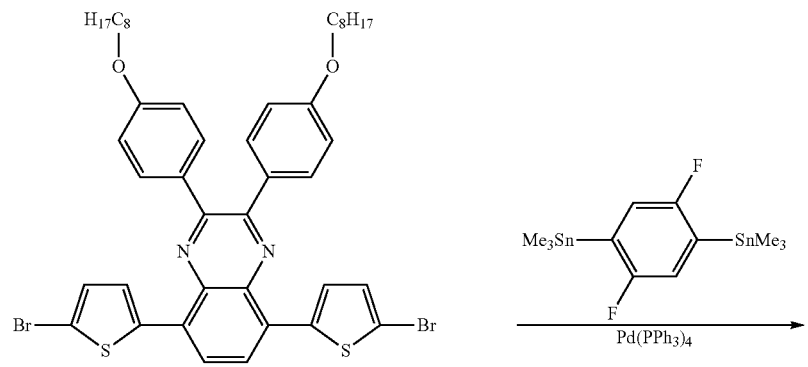

A quinoxaline derivative (Yield: about 65%) was obtained in the same manner as in Preparative Example 2, with the exception that a 3-octylthiophene borane derivative was used, instead of the 2-thiophene borane derivative.

$^1$H-NMR (300 MHz, CDCl$_3$) δ(ppm) 0.92 (CH$_3$), 1.35~1.42 (CH$_2$), 1.72 (CH$_2$), 2.82 (Thiophene-CH$_2$), 3.78~4.00 (—O—CH$_2$), 6.75 (Phenyl-H), 6.97 (Thiophene-H), 7.55~7.75 (Phenyl-H), 8.22 (Qunioxaline-H).

PREPARATIVE EXAMPLE 4

Synthesis of Polymer Semiconductor (Poly-1) Represented by Formula 5a

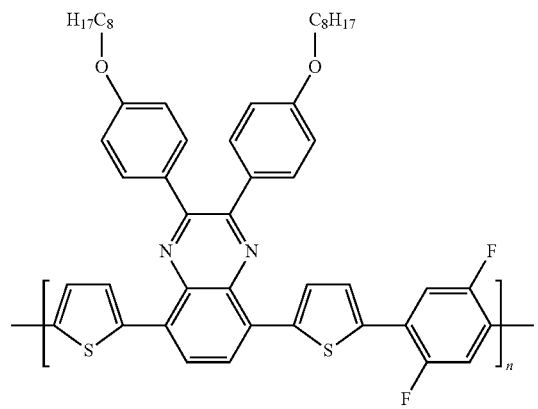

In a nitrogen atmosphere, the quinoxaline derivative (about 0.5 g, about 0.61 mmol) obtained in Preparative Example 2 and bis (trimethylstannyl)difluorophenyl (about 0.27 g, about 0.61 mmol) were charged in equimolar amounts into a reactor and then weakly heated to thus completely dissolve them in anhydrous DMF, after which a polymerization catalyst, a palladium (0) compound ($Pd(PPh_3)_4$), was added in an amount of about 10 mol % based on the total amount of the monomer, followed by allowing the reaction to proceed at about 85° C. for about 24 hours. The resultant reaction solution was cooled to about room temperature and then filtered to thus prepare a polymer solid, which was then washed with aqueous hydrochloric acid/chloroform two times, aqueous ammonia/chloroform two times, and water/chloroform once, in that order, re-precipitated in methanol for recovery, and dried, thereby obtaining a red polymer (Poly-1) (Yield: about 0.15 g, about 33%, Number-Average MW=about 8,000).

$^1$H-NMR (300 MHz, $CDCl_3$) δ(ppm) 0.90 ($CH_3$), 1.32~1.50 ($CH_2$), 1.74 ($CH_2$), 3.76~4.00 (—O—$CH_2$), 6.75 (Phenyl-H), 7.35~7.88 (Thiophene-H, Phenyl-H, Fluorophenyl-H), 8.24 (Qunioxaline-H).

EXAMPLE 1

Fabrication of OTFT Using Polymer Semiconductor

On a washed glass substrate, chromium for a gate electrode was deposited to a thickness of about 1000 Å through sputtering, and then $SiO_2$ for a gate insulating layer was deposited to a thickness of about 1000 Å through CVD. Subsequently, ITO for source/drain electrodes was deposited to a thickness of about 1200 Å thereon through sputtering ITO. Before the deposition with organic semiconductor material, the substrate was washed with isopropyl alcohol for about 10 minutes and then dried for use. The sample was immersed in a about 10 mM octadecyltrichlorosilane solution, diluted in chloroform for about 30 seconds, washed with acetone, and then dried, after which poly(oligothiophene-arylene) (Poly-1), synthesized in Preparative Example 4, was dissolved to about 1 wt % in chloroform, applied to a thickness of about 1000 Å at about 1000 rpm, and then baked at about 100° C. for about 1 hour in an argon atmosphere, thereby fabricating an OTFT.

Figure 3:
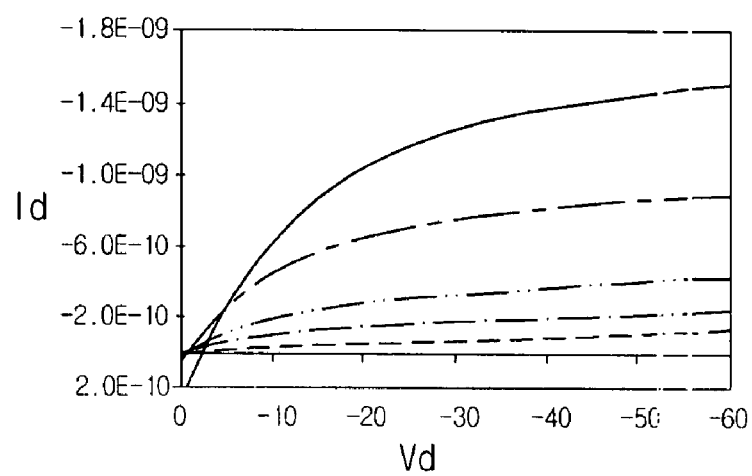
Figure 4:
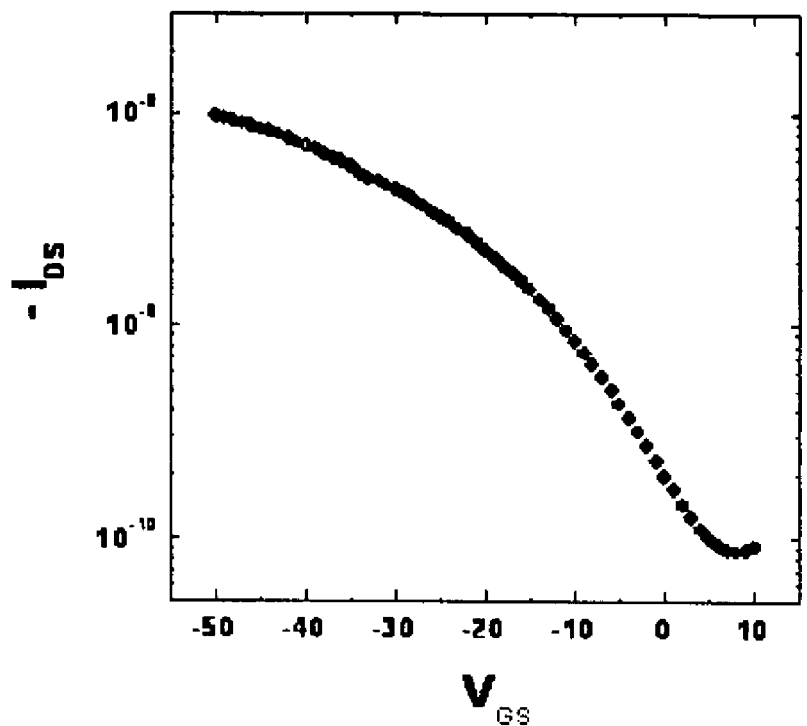
Figure 5:
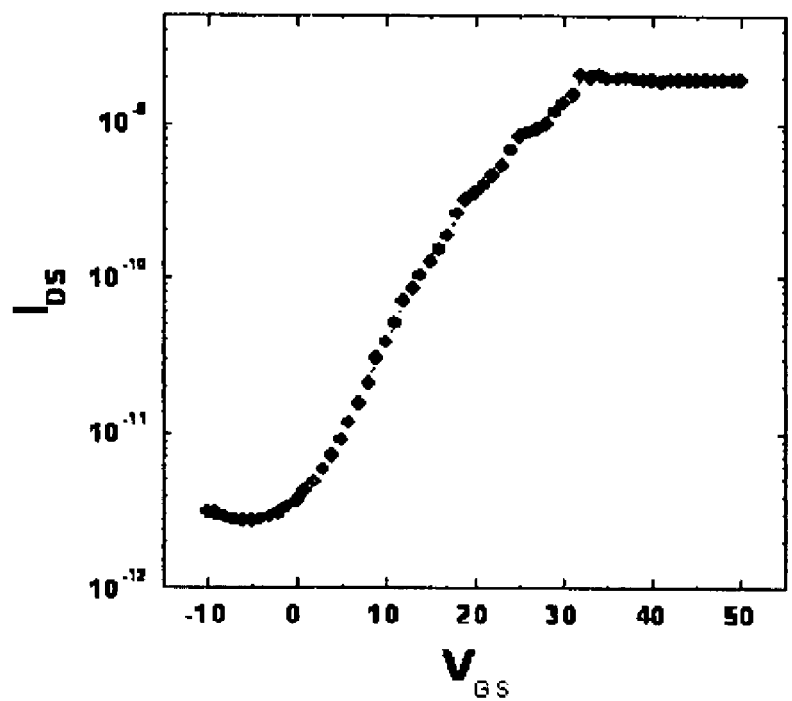

The current transfer properties of the device fabricated in Example 1 were measured using a semiconductor characterization system (4200-SCS), available from KEITHLEY. The results are shown in FIGS. 3 to 5. As is apparent from FIGS. 4 and 5, the device of Example 1 may be electrically active upon the application of negative voltage, to thus exhibit p-type transistor properties, and also to be electrically active even upon the application of positive voltage, to thus exhibit n-type transistor properties.

The charge mobility was calculated using the following current equation for the saturation region. For example, the current equation for the saturation region was converted into a graph of $(I_{SD})^{1/2}$ and $V_G$, and the charge mobility was calculated from the slope of the converted graph:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

wherein $I_{SD}$ is source-drain current, μ or $\mu_{FET}$ is charge mobility, $C_o$ is oxide film capacitance, W is the channel width, L is the channel length, $V_G$ is the gate voltage, and $V_T$ is the threshold voltage.

The cut-off leakage current ($I_{off}$), which is current flowing in the off-state, was determined to be the minimum current in the off-state in the current ratio.

The $I_{on}/I_{off}$ ratio was determined as the ratio of the maximum current in the on-state to the minimum current in the off-state.

TABLE 1

| | Hole Moblilty ($\mu_h$) | Electron Moblilty ($\mu_e$) |
|---|---|---|
| Ex. 1 | $1.0 \times 10^{-4}$ cm$^2$/Vs | $3 \times 10^{-6}$ cm$^2$/Vs |

Bottom Contact type TFT (W/L=1 mm/100 μm), measured in air.

As is apparent from Table 1, the organic polymer semiconductor of Formula 5a may exhibit both p-type transistor properties and n-type transistor properties, and therefore may be used as polymer semiconductor material for ambipolar transistors.

As described hereinbefore, example embodiments may provide an organic polymer semiconductor, a method of preparing the same, and an OTFT using the same. In the organic polymer semiconductor according to example embodiments, an aromatic ring derivative having n-type semiconductor properties and a heteroaromatic ring having n-type semiconductor properties may be contained in the main chain of the polymer. Thus, when such an organic polymer semiconductor is used in the organic active layer of an electronic device, e.g., an OTFT, an ambipolar transistor exhibiting both p-type transistor properties and n-type transistor properties may be realized. The organic polymer semiconductor of example embodiments may be improved in terms of solubility in a general organic solvent, processibility, and thin film properties.

Although example embodiments have been disclosed for illustrative purposes, those skilled in the art will appreciate that various modifications, additions and substitutions are possible, without departing from the scope and spirit of the accompanying claims.

What is claimed is:

1. An organic polymer semiconductor, represented by Formula 1 below:

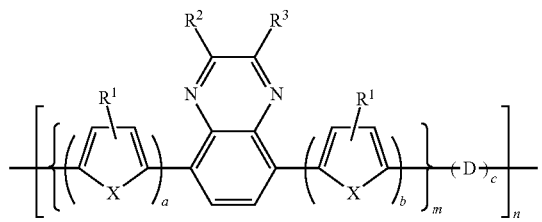

Formula 1 wherein $R^1$ is hydrogen, a hydroxyl group, a $C_{1-20}$ linear, branched or cyclic alkyl group, a $C_{1-20}$ alkoxyalkyl group, or a $C_{1-16}$ linear, branched or cyclic alkoxy group, $R^2$ and $R^3$ are each independently hydrogen, a hydroxyl group, a $C_{1-20}$ linear, branched or cyclic alkyl group, a $C_{1-20}$ alkoxyalkyl group, a $C_{1-16}$ linear, branched or cyclic alkoxy group, or a $C_{4-30}$ substituted or unsubstituted aryl group or heteroaryl group, D is a $C_{4-30}$ aryl group or alkylene substituted with an electron-withdrawing side-chain, including —CN, —NO$_2$, —COOR, fluorine or a $C_{1-16}$ perfluoroalkyl group, and X is S, O, Se, N—H, or N—R, in which R is hydrogen or a $C_{1-6}$ linear, branched or cyclic alkyl group, a, b and c are each independently an integer of about 1 or about 2, m is an integer from about 1 to about 4, and n is an integer from about 4 to about 100.

2. The organic polymer semiconductor as set forth in claim 1, wherein the D, which is a monomer in Formula 1, is at least one selected from a group represented by Formula 3 below:

Formula 3

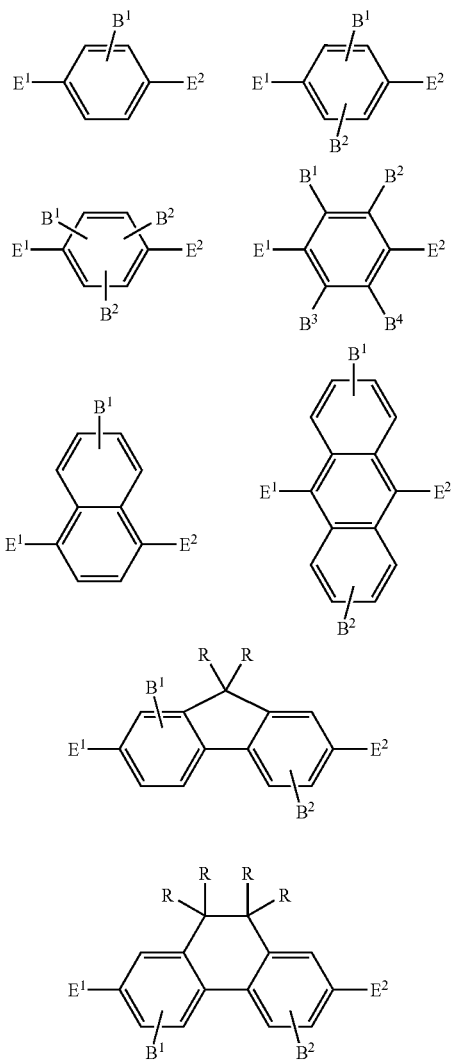

wherein $B^1$, $B^2$, $B^3$ and $B^4$ are each independently H, —CN, —NO$_2$, —COOR, fluorine, or $C_{1-16}$ perfluoroalkyl group, $E^1$ and $E^2$ are each independently a halogen atom, including Br, Cl or I, a trialkyltin group, or a borane group, and R is hydrogen or a $C_{1-6}$ linear, branched or cyclic alkyl group.

3. The organic polymer semiconductor as set forth in claim 2, wherein the monomer D is a monomer represented by Formula 4 below:

Formula 4

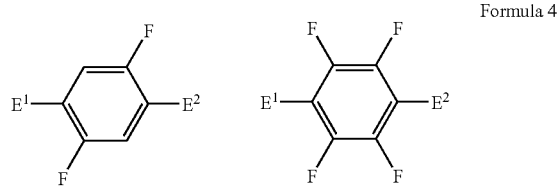

wherein $E^1$ and $E^2$ are each independently a halogen atom, including Br, Cl or I, a trialkyltin group, or a borane group.

4. The organic polymer semiconductor as set forth in claim 1, wherein the organic polymer semiconductor is selected from the group consisting of materials represented by Formulas 5a to 5j below:

Formula 5a

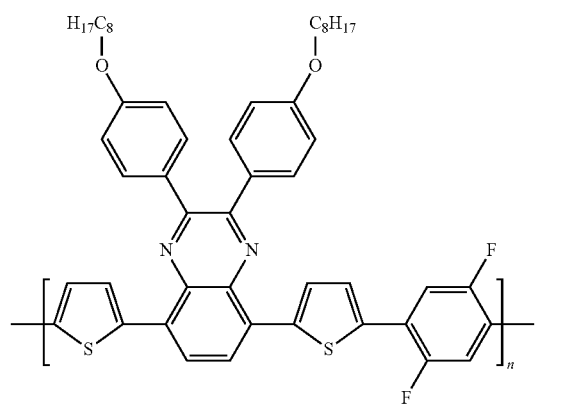

Formula 5b

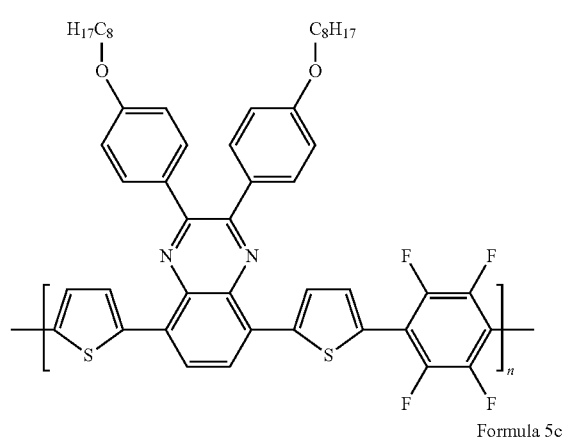

Formula 5c

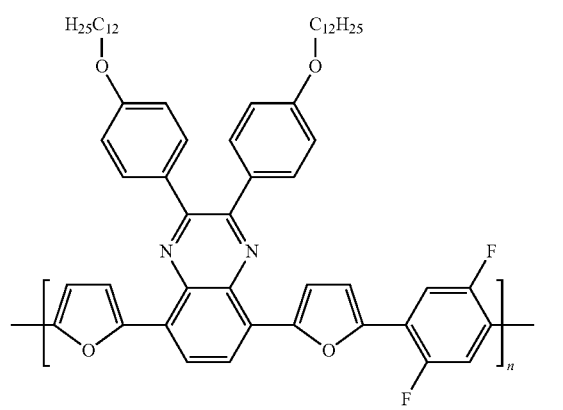

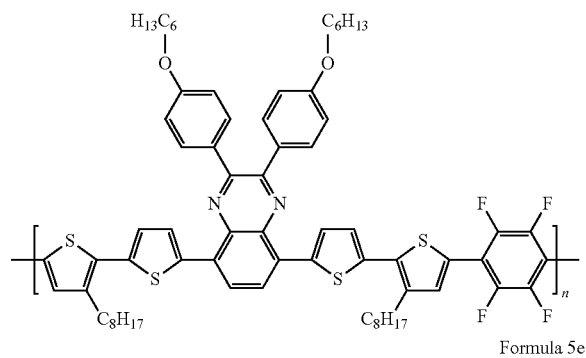

in Formulas 5a to 5j, n is an integer from about 4 to about 100.

5. The organic polymer semiconductor as set forth in claim 1, which has a number average molecular weight ranging from about 5,000 to about 50,000.

6. An ambipolar organic thin film transistor, comprising a gate electrode, a gate insulating layer, an organic active layer, and source/drain electrodes on a substrate, wherein the organic active layer includes the organic polymer semiconductor of claim 1.

7. The transistor as set forth in claim 6, wherein the organic active layer is formed into a thin film through screen printing, printing, spin coating, dipping or ink jetting.

8. The transistor as set forth in claim 6, wherein the insulating layer is formed using material selected from the group consisting of ferroelectric insulators including $Ba_{0.33}Sr_{0.66}TiO_3$(BST), $Al_2O_3$, $Ta_2O_5$, $La_2O_5$, $Y_2O_5$, and $TiO_2$; inorganic insulators including $PbZr_{0.33}Ti_{0.66}O_3$(PZT), $Bi_4Ti_3O_{12}$, $BaMgF_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, SiNx, and AlON; and organic insulators including polyimide, benzocyclobutane (BCB), parylene, polyvinylalcohol, and polyvinylphenol.

9. The transistor as set forth in claim 6, wherein the substrate is formed using material selected from the group consisting of glass, polyethylenenaphthalate (PEN), polyethyleneterephthalate (PET), polycarbonate, polyvinylalcohol, polyacrylate, polyimide, polynorbornene, and polyethersulfone (PES).

10. The transistor as set forth in claim 6, wherein the gate electrode and the source/drain electrodes are formed using material selected from the group consisting of gold (Au), silver (Ag), aluminum (Al), nickel (Ni), and indium tin oxide (ITO).

11. An electronic device comprising the ambipolar organic thin film transistor of claim 6.

* * * * *